US009641191B1

(12) United States Patent
Volfbeyn et al.

(10) Patent No.: US 9,641,191 B1
(45) Date of Patent: May 2, 2017

(54) DIGITAL DOWN CONVERTER WITH EQUALIZATION

(71) Applicant: Guzik Technical Enterprises, Mountain View, CA (US)

(72) Inventors: Semen P. Volfbeyn, Palo Alto, CA (US); Anatoli B. Stein, Atherton, CA (US); Alexander Taratorin, Palo Alto, CA (US)

(73) Assignee: Guzik Technical Enterprises, Mountain View, CA (US)

( * ) Notice: Subject to any disclaimer, the term of this patent is extended or adjusted under 35 U.S.C. 154(b) by 0 days.

(21) Appl. No.: 15/229,578

(22) Filed: Aug. 5, 2016

Related U.S. Application Data

(60) Provisional application No. 62/254,394, filed on Nov. 12, 2015.

(51) Int. Cl.
*H03M 1/06* (2006.01)
*H03M 1/60* (2006.01)
*H03M 1/08* (2006.01)

(52) U.S. Cl.
CPC .......... *H03M 1/60* (2013.01); *H03M 1/0626* (2013.01); *H03M 1/0836* (2013.01)

(58) Field of Classification Search
CPC .... H03M 1/60; H03M 1/0836; H03M 1/0626; H03M 1/12
USPC .......................... 341/155, 156, 118, 117, 119
See application file for complete search history.

(56) References Cited

U.S. PATENT DOCUMENTS

| 7,408,495 | B2 | 8/2008 | Stein et al. | |
| 8,310,387 | B2 * | 11/2012 | Harris | H03M 1/0836 341/118 |
| 2015/0200679 | A1 | 7/2015 | Stein et al. | |

FOREIGN PATENT DOCUMENTS

EP              2773045 A1       9/2014

* cited by examiner

*Primary Examiner* — Jean B Jeanglaude
(74) *Attorney, Agent, or Firm* — Burns & Levinson LLP; Joseph M. Maraia

(57) ABSTRACT

A digital down converter with an equalizer translates an ADC output signal to a low frequency spectral region, followed by decimation. All operations of correction of the processed signal are carried out with a reduced sampling rate compared with sampling rates of the prior art. Equalization is performed only in a frequency pass band of the down converter. The achieved reduction of the required computation resources is sufficient to enable the down converter with equalization to operate in a real time mode.

12 Claims, 10 Drawing Sheets

ADC output

LPF-Decimator output

Down converter output

ADC output

LPF-Decimator output rotator output mismatch equalizer output subtractor output

DIGITAL DOWN CONVERTER WITH EQUALIZATION

RELATED APPLICATIONS

This application claims priority to U.S. Provisional Patent Application No. 62/254,394, filed Nov. 12, 2015, which is incorporated in its entirety herein by reference.

FIELD OF THE TECHNOLOGY

The technology relates to high speed analog-to-digital converters (ADCs) and, more particularly, to ADC digital equalization in frequency down converters intended for wireless receivers, telecommunications and the like.

BACKGROUND OF THE TECHNOLOGY

The down converters in wireless communication systems perform a transformation of a radio frequency (RF) signal into a baseband signal centered at zero frequency. In high performance equipment, digital down converters are used where an analog RF signal is converted into a digital signal followed by processing in digital form. Typically, a high speed ADC is used because of the high frequency RF signals.

High speed analog to digital converters are typically built as composite ADCs that consist of a number of time interleaved sub-ADCs with a common input and sequential timing. In general, the amplitude and phase/frequency responses of the different sub-ADCs are not identical, resulting in specific signal distortions ("Type 1 distortions"), for example, in the form of spurious frequency components. In the prior art, in order to prevent these distortions, equalization of the responses of the sub-ADCs is used (see, for example, U.S. Pat. No. 7,408,495).

Additional signal distortions ("Type 2 distortions") are due to deviations of the amplitude and phase/frequency responses of the respective ADCs, averaged over the set of the sub-ADCs, from ideal responses. In general, an equalizer for correcting for such distortions, is required to perform two functions: (i) compensate for mismatches of the frequency responses of the sub-ADC's, and (ii) line up the averaged frequency responses of the ADC.

A block diagram of a conventional digital down converter 8, with an equalizer 12, is shown in FIG. 1. In down converter 8, an input RF signal is applied to the input of a composite ADC 10 (including interleaved sub-ADCs, not shown). ADC 10 transforms the input RF signal into a digital signal, which is applied at an input of equalizer 12. It is important to note that the equalizer 12 is positioned upstream with respect to any signal down conversion, and thus must operate at high frequency, particularly for RF input signals.

Mismatches of the frequency responses of the interleaved sub-ADCs of the composite ADC 10, and deviations from the average frequency responses of the ADC 10 are corrected by equalizer 12. The output of equalizer 12 is applied to in-phase input 16A and quadrature input 16B of an I/Q demodulator 16. I/Q demodulator 16 includes two mixers 20A and 20B which mix the signals at inputs 16A and 16B with an output of a local oscillator 24, operating at a local oscillator frequency FLO with two sinusoidal outputs having a phase difference of 90°. Outputs of mixers 20A and 20B are applied to a respective ones of low pass filter I 28A and low pass filter Q 28B, and then to a respective one of decimator I 30A and decimator Q 30B, to produce respective baseband outputs labeled as In-Phase Output I and Quadrature Output Q in FIG. 1.

Most down converter applications (such as wireless terminals of different communication systems, radar systems and the like) require real time processing of a received input signal. The necessity to operate in a real time mode imposes restrictions on the bulk of computing resources implemented in the hardware. Equalizer 12, in the down converter of the type illustrated by the block diagram of FIG. 1, is usually built as a conventional FIR filter. The most resources-consuming components of the FIR filter are multipliers. Because of the difference between the RF signal frequency (usually several GHz) and the frequency of operation of present-day FPGAs (up to 200-250 MHz), each multiplication in the FIR is carried out by a group of multipliers connected in parallel. The required number of multipliers becomes a main reason that makes it impossible to build an equalizer that operates in a real time mode.

In US Patent Application Publication US2015/0200679 A1, an improved equalizer structure is proposed, where the calculations are transferred from a high frequency region at an ADC output to low frequency down converted signals I/Q. In that way, a reduction of required computation resources is achieved. However, equalization of ADC responses as there-described, is performed in the entire frequency range of the ADC output, even though the down converter uses only frequencies located in the frequency band of the received input signal. As a consequence, a considerable portion of the performed calculations turn out to be redundant, and it remains difficult to build a down converter with an equalizer operating in a real time mode.

A structure of a down converter that is different from that of the block diagram of FIG. 1, was suggested in European Patent Application EP 2 773 045 A1. In that application, an adaptive algorithm is used that comprises a tracing mechanism for detection of statistical parameters of a processing signal. The found statistical parameters are employed to perform signal correction that extinguishes the spurious components. Since all operations in the corresponding device are done at the ADC sampling frequency, the required resources are the same as in the block diagram of FIG. 1 (or even more because of additional units of the tracing mechanism).

Overall, the prior art does not provide methods for ADC digital equalization in frequency down converters which enables high speed, real time operation.

SUMMARY

A digital down converter with an equalizer is disclosed, where a translation of an ADC output signal to a low frequency spectral region, followed by decimation, is performed. All operations of correction of the processed signal are carried out with a reduced sampling rate compared with sampling rate of the ADC. Equalization is performed only in a frequency pass band of the down converter. The achieved reduction of the required computation resources is sufficient to enable the down converter with equalization to operate in a real time mode.

Spurious components at the ADC output appear as a reflection from a sub-harmonic Fsh of sampling frequency Fs. Where the processed signal has frequency spectrum S(f), then the mismatch of frequency responses in the sub ADCs of the composite ADC causes appearance of a spurious complement with a spectrum Sspur(f)=S(Fsh−f)·Amp·exp(j·Phs), where the amplitude Amp and the phase shift Phs depend on the mismatch. As an example, if the ADC sampling frequency is 40 GHz and the signal occupies the band 9.4 GHz-10.4 GHz, the frequency component 9.8 GHz of the signal causes appearance of a reflection from 40/2=20 GHz, i.e. a spurious component 20−9.8=10.2 GHz that falls within the signal band. The frequencies of the signal components and frequencies of produced spurious components are symmetrical in relation to the frequency Fsh/2 (the frequency 10 GHz in the example). The present technology uses this relationship between the signal frequencies and the spurious frequencies to suppress the spurious components.

Many down converter applications must accommodate rapid changes of signal carrier and/or converter bandwidth. Change of these parameters demands modification of equalizer coefficients. The calculations of the equalizer coefficients are based on the use of the frequency responses of sub-ADCs that form the composite ADC, and measurement of which is time consuming. To perform this, in a form, the frequency responses of the sub-ADCs are measured once at the production time, or at one of seldom performed calibrations, followed by saving of the results in a memory, whereas calculation of equalizers coefficients is carried out promptly, whenever the converter parameters are changed.

DETAILED DESCRIPTION

Figure 2:
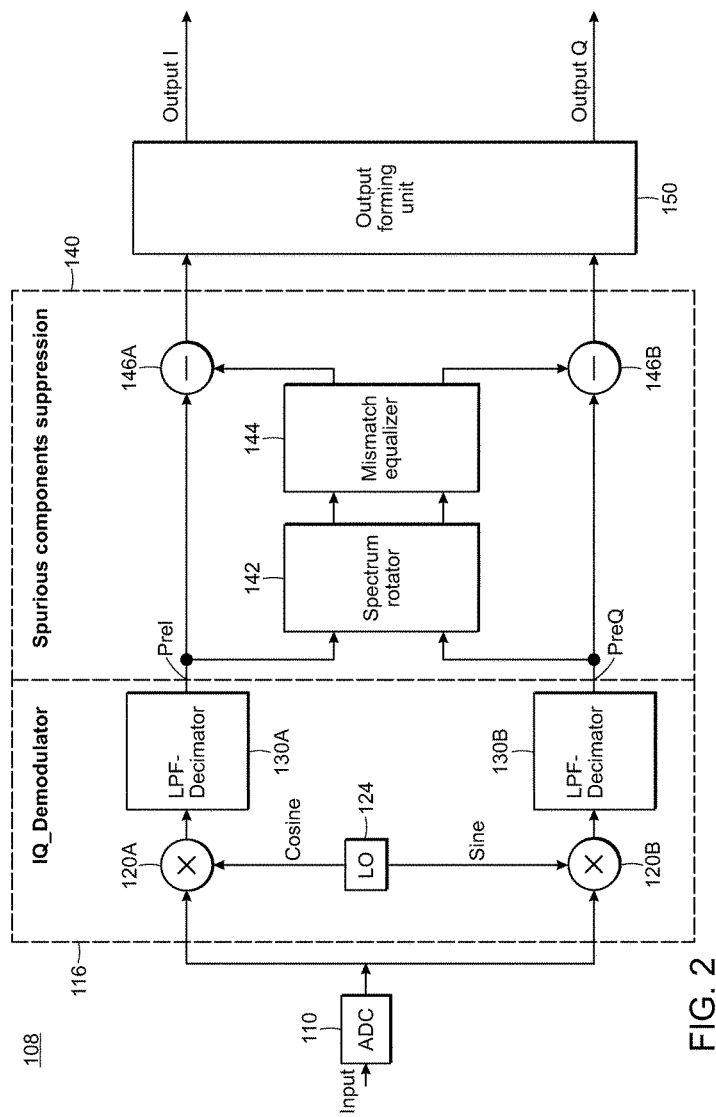
FIG. 2 shows a digital down converter with equalization according to the present technology.

FIG. 2 shows a block diagram of a digital down converter 108 with equalization according to the present technology. The down converter 108 includes a composite ADC 110, and three principal parts: an IQ_Demodulator 116, a spurious components suppression unit 140 and output forming unit 150.

Figure 1:
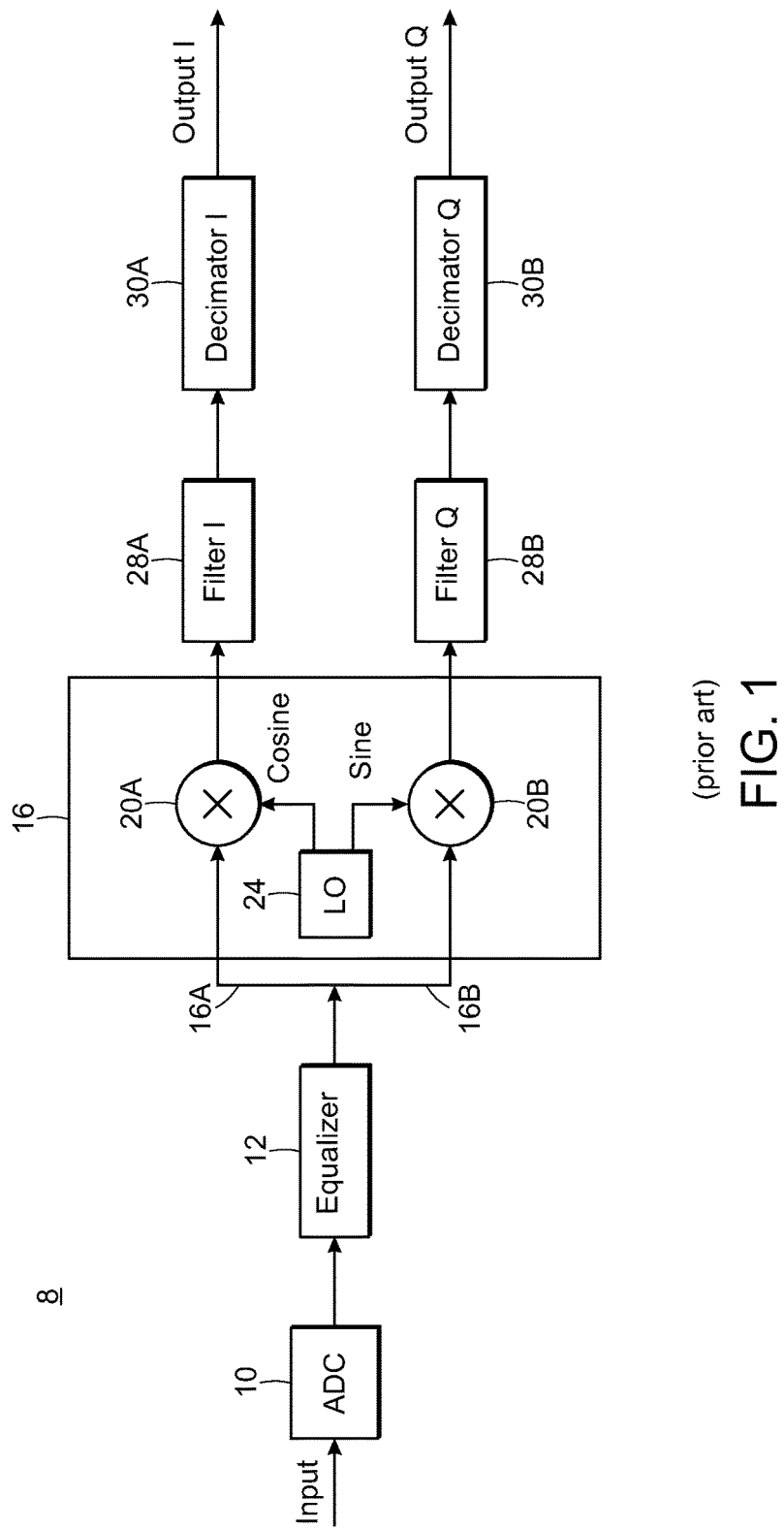
FIG. 1 shows a conventional digital down converter with equalization (prior art)

The IQ_Demodulator 116 is in part similar to IQ_Demodulator 16 of FIG. 1, and has an input coupled to the output of the composite ADC 108, and includes two mixers 120A and 120B, a local oscillator LO 124, with a frequency FLO and quadrature outputs coupled to the respective mixers, and two low pass filters with decimation LPF-Decimator I 130A and LPF-Decimator Q 130B.

The IQ_Demodulator 116 performs frequency translation of its input signal (from composite ADC 108), down shifting that signal to a low frequency region, and produces two outputs: an In-Phase (I) signal at the output of an upper (as shown in FIG. 2) branch, and a Quadrature (Q) signal at the output of the lower (as shown in FIG. 2) branch. The down shift of the I signal and Q signal to the low frequency range followed by decimation (by LPF-Decimator I 130A and LPF-Decimator Q 130B) allow the spurious components suppression unit 140 and output forming unit 150 (downstream from the IQ_Demodulator 116) to operate at a relatively low speed (compared to that of the ADC), thereby enabling a significant reduction of required computing recourses compared to the converter of FIG. 1.

The I signal and Q signal from the outputs of the IQ_Demodulator 116, are applied to a PreI input and a PreQ input, respectively, of spurious component suppression unit 140. The spurious component suppression unit 140 comprises a spectrum rotator 142, a mismatch equalizer 144 and two subtractors, subtractor 146A and subtractor 146B.

The spectrum rotator 142 receives the I signal and Q signal from the IQ_Demodulator 116 and performs spectrum rotation, namely, a frequency transformation of those signals, turning the signal spectrum S(f) around, i.e., rotating it, about a pivot frequency Fp=Fsh−FLO for each, and converting each into a rotated spectrum signal having a spectrum Srotated(f)=S(Fp-f) on an output of the spectrum rotator 142. Here, Fsh is the frequency of a sub-harmonic of the sampling frequency, reflection from which has caused the appearance of the spurious component.

The spectrum rotator operation causes the signal component and the spurious component to interchange their positions on the frequency axis: the spurious component occupies now the former frequency of the signal component, and the signal component occupies now the former frequency of the spurious component.

The signals from the outputs of the spectrum rotator 142 are applied to inputs of the mismatch equalizer 144. The mismatch equalizer 144 changes the amplitude and the phase of each signal frequency component, making those components each have an amplitude and phase equal to the amplitude and the phase of a corresponding spurious component at inputs of the mismatch equalizer 144. After that transformation, each signal component at the outputs of mismatch equalizer 144 becomes equal to the corresponding spurious component at the output of the corresponding one of LPF-Decimators 128A and 128B.

Calculations of the coefficients of mismatch equalizer 144 are based on the required amplitude and phase responses that such equalizer should possess. To find the required frequency responses, the frequency responses of each sub-ADC in the composite ADC are first measured and saved in a memory (these measurements are performed typically during production of the down converter). Thereafter, the next sequence of operations is carried out in real time for each frequency from the chosen set of frequencies in the passband of the converter 108:

i. calculation of a sine wave of the chosen frequency, simulating a signal, produced by the composite ADC 108 that possesses measured frequency responses;

ii. calculation of the amplitude and phase of both the signal frequency component and the spurious frequency component at the output of the spectrum rotator 142 by simulation of a synchronous detection;

iii. calculation of the required amplitude response of the mismatch equalizer 144 at the chosen frequency as the ratio of the spurious frequency component amplitude to the signal component amplitude;

iv. calculation of the required phase response of the mismatch equalizer 144 at the chosen frequency as the difference between the spurious frequency component phase and the signal component phase.

Each of subtractor 146A and subtractor 146B in the spurious component suppression unit 140 has two inputs. A first input is connected to the output of the corresponding one of LPF-Decimator 128A and LPF-Decimator 128B, and the second input is connected to the corresponding one of the outputs of the mismatch equalizer 144. The signal at the output of a subtractor is formed as a difference between the signal at the first input and the signal at the second input. Since the amplitude of each frequency component in the signal at the output of the mismatch equalizer 144 equals the amplitude of the corresponding spurious component of the signal at the output of the corresponding one of LPF-Decimator 128A and LPF-Decimator 128B, the spurious components at the subtractor outputs of subtractor 146A and subtractor 146B are canceled out.

The outputs of the spurious component suppression unit 140 are connected to corresponding inputs of the outputs forming unit 150. The outputs forming unit 150 transforms the signals produced by the spurious component suppression unit 140 into output signals of the digital down converter with equalization 108. The primary operation performed by the outputs forming unit 150, is the correction of the signal distortions caused by deviations of the ADC averaged frequency responses from ideal. An extra function of the outputs forming unit 150 is described below.

The joint action of units 140 and 150, as positioned in the block diagram of FIG. 2 after the IQ_Demodulator 116, corrects both types of distortions (Type 1 and Type 2) in the processed signal.

Figure 3:
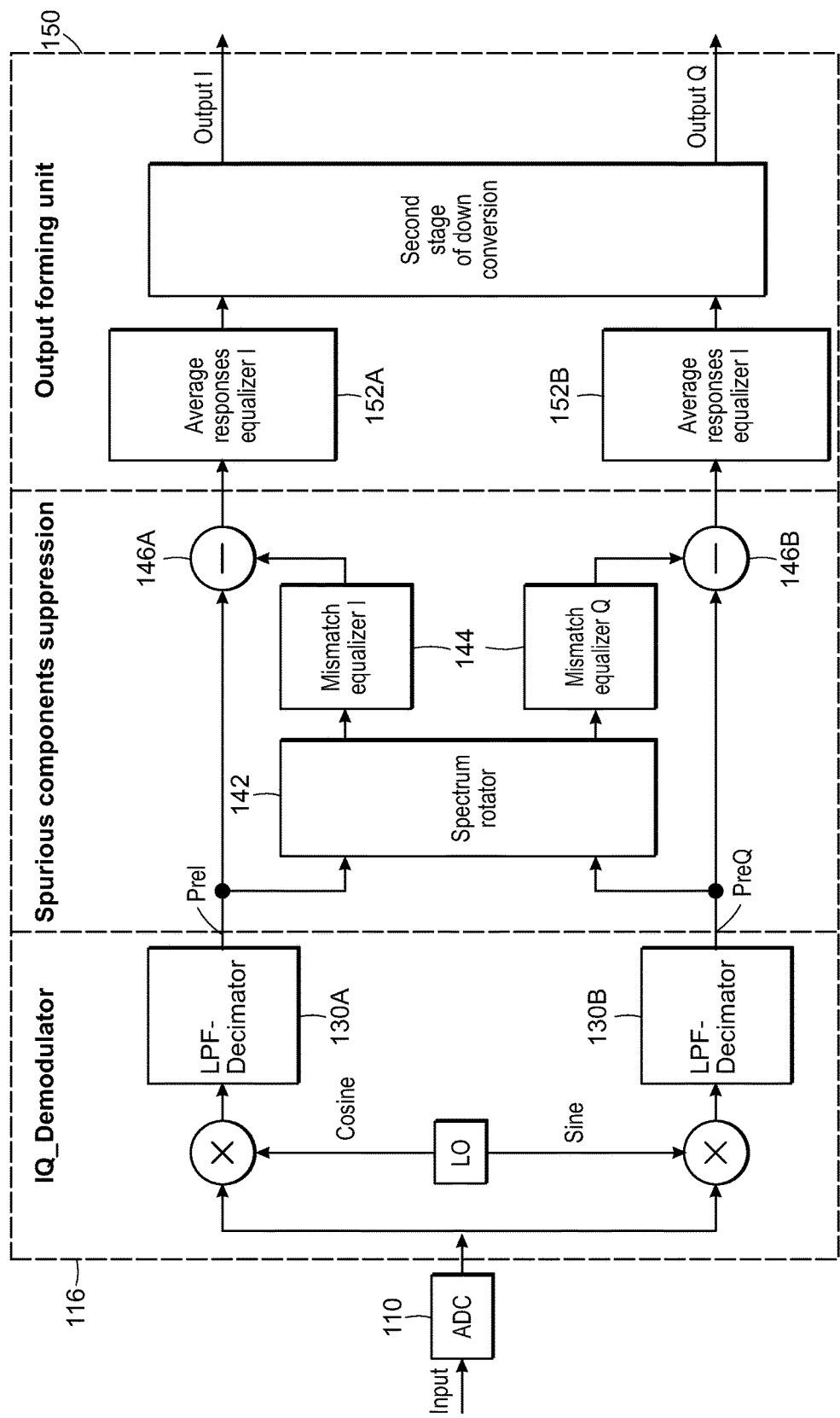
FIG. 3 shows block diagram of the first embodiment of the present technology.
Figure 6:
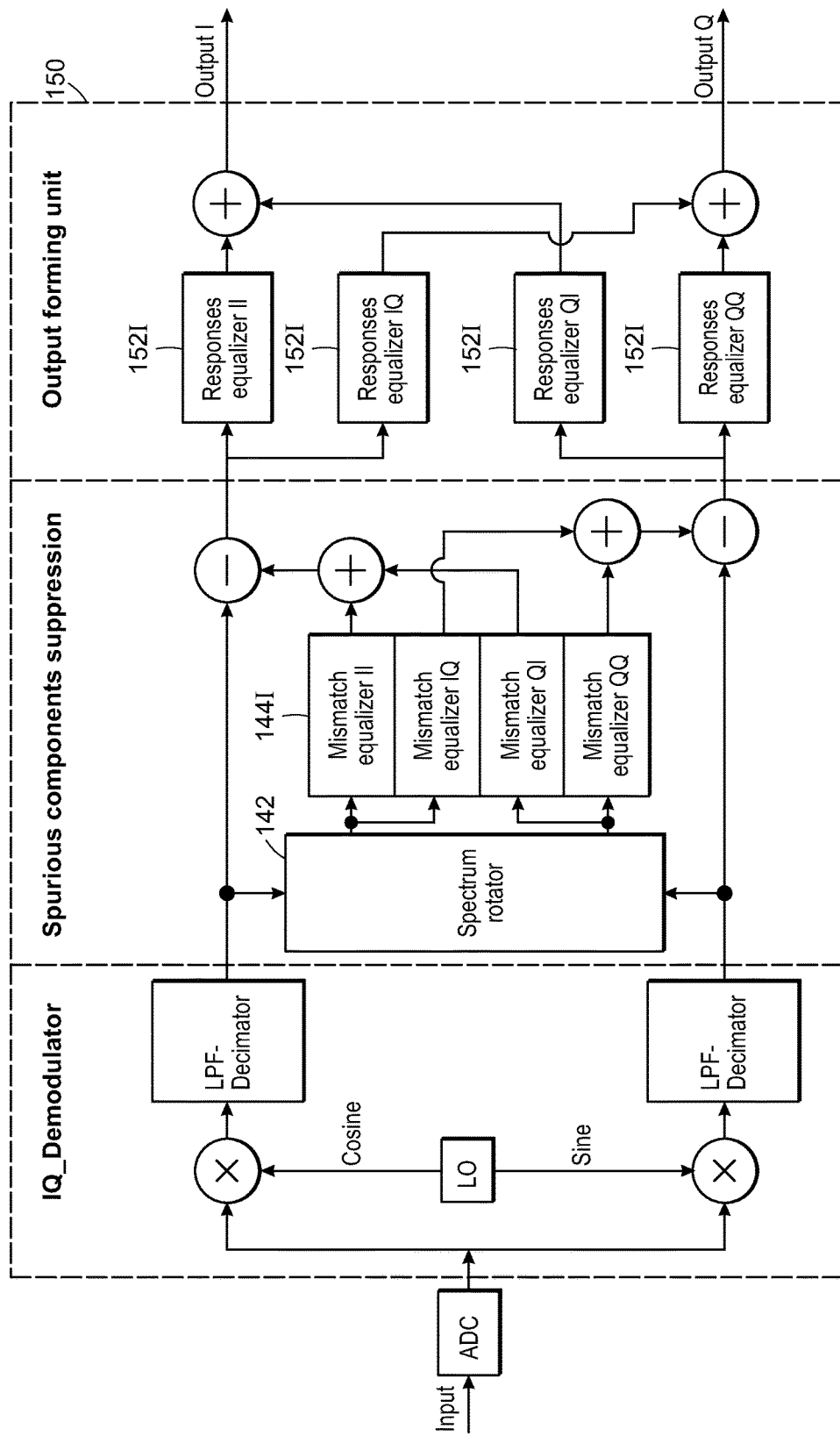
FIG. 6 shows block diagram of the second embodiment of the present technology.

Two different embodiments of converter 108, both of which correspond to the block diagram of FIG. 2, are shown in FIG. 3 and FIG. 6, as described below. The embodiments of FIG. 3 and FIG. 6 use different methods of down conversion: the embodiment of FIG. 3 is based upon a super heterodyne principle, whereas the embodiment of FIG. 6 employs direct down conversion. However, the embodiments of FIG. 3 and FIG. 6 both perform equalization at low frequency, in contrast to the prior art down converter of FIG. 1.

In the embodiment of FIG. 3, the IQ_Demodulator 116 shifts the signal from the output of ADC 108 to an intermediate frequency, where all operations of signal correction are performed. Then the second stage of down conversion transfers the signal to the final frequency range.

Figure 4A:
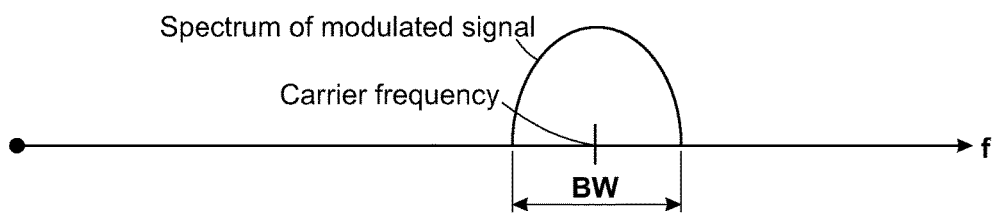
FIGS. 4A-4C illustrate the frequency transformations performed in the first embodiment of the present technology.
Figure 4B:
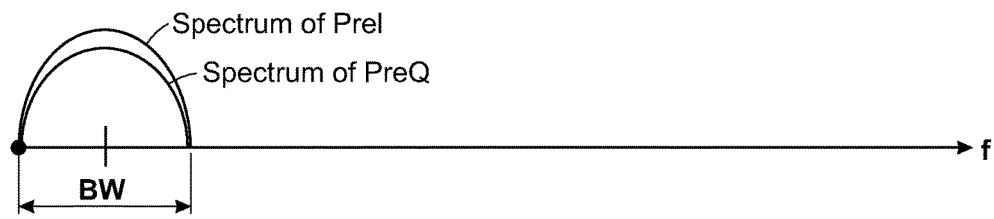
Figure 4C:

FIGS. 4A-4C show the spectra of the signals in the different points of the block diagram of FIG. 3. In particular, FIG. 4A shows a spectrum of a digital signal at the output of ADC 108, a modulated signal centered about a carrier signal. The signal bandwidth is BW, and the carrier frequency is at the center of the band. The local oscillator (LO) frequency in the IQ_Demodulator 116 is set to be equal to the left edge of the signal frequency band, that is, FLO=Fcarrier−BW/2. With that LO frequency, the IQ_Demodulator 116 shifts the processed signal to the frequency band from f=0 to f=BW.

The spectra of signal I and signal Q at the outputs of LPF-Decimators 128A and 128B (and applied to inputs PreI and PreQ of spurious components suppression unit 140) are shown in FIG. 4B. Signal processing performed by spurious component suppression unit 140 and the output forming unit 150 suppresses the spurious component and flattens up the signal frequency responses, and then, in a second stage, a frequency transformation is performed with the carrier frequency BW/2, forming the outputs signals I and Q. As may be seen in FIG. 4C the spectra of these signals occupy the frequency band from f=0 to f=BW/2.

The block diagram of the FIG. 3 in the major part repeats the block diagram of the FIG. 2, but shows an exemplary internal structure of the mismatch equalizer 144 and the output forming unit 150. As before, the block diagram consists of an IQ_Demodulator 116, a spurious component suppression unit 140 and an output forming unit 150.

Since the IQ_Demodulator 116 of FIG. 3 transfers the signal to the frequency band from f=0 to f=BW without folding its spectrum, the mismatch equalizer 144 is implemented by a mismatch equalizer I and mismatch equalizer Q, each operating in a corresponding branch of the spurious component suppression unit 140.

The output forming unit 150 in the block diagram of FIG. 3 consists of two averaged responses equalizers (I and Q) 152A and 152B and a second stage of down conversion, the latter performing frequency transformation with the carrier BW/2 and completing frequency translation of the signal.

Figure 5A:
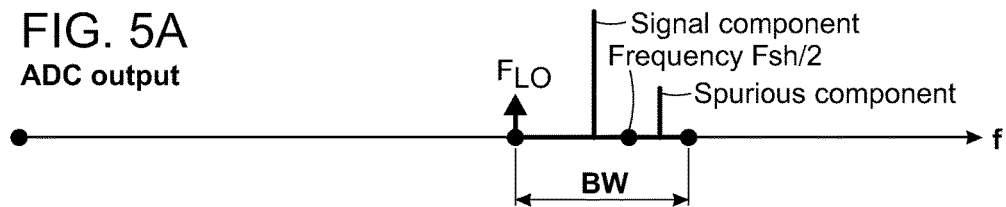
FIGS. 5A-5E illustrates the operation of the spurious components suppression unit of the first embodiment of the present technology.
Figure 5B:
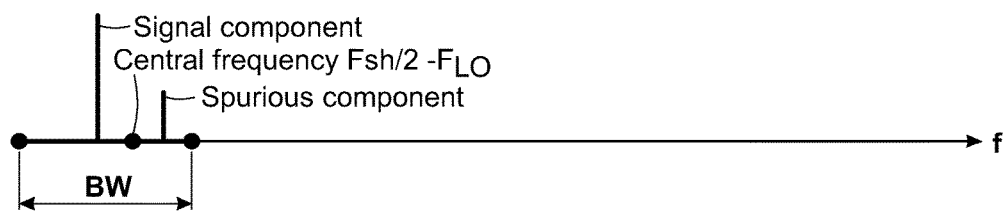

As an illustration to the operation of the spurious component suppression unit 140 of FIG. 3, FIGS. 5a-5e show spectra of the processed signal in the different points of that unit. In this example, the spectrum contains only one signal component and a corresponding spurious component. FIG. 5a shows the spectrum at the output of ADC 108, where the signal component and the spurious component are symmetrical in relation to the frequency Fsh/2. The LO frequency is positioned at the left edge of signal frequency band. After down conversion in the IQ_Demodulator 116, the signal spectrum at the output of each LPF-Decimator 116 is shifted to the frequency region from f=0 to f=BW (see FIG. 5b). The signal component and the spurious component are now symmetrically disposed about the frequency Fsh/2−FLO.

Figure 5C:
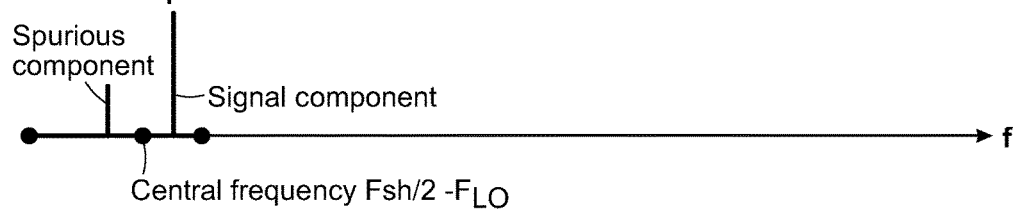

As shown in FIG. 5c, at the output of spectrum rotator 142, the signal component and the spurious component of signal spectrum have interchanged their positions: the spurious component occupies now the former frequency of the signal component and the signal component occupies now the former frequency of the spurious component.

Figure 5D:
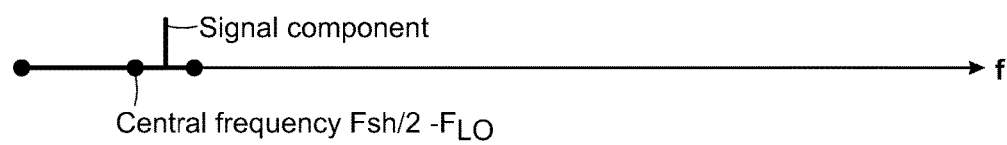

FIG. 5d shows spectrum at the output of the mismatch equalizer 144. The signal component here is equal to the spurious component in FIG. 5b. The spurious component after transformation in the mismatch equalizer 144, becomes negligibly small and is not shown in FIG. 5d.

Figure 5E:
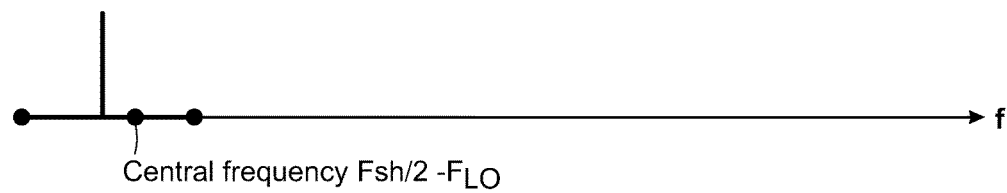

FIG. 5e shows spectrum at the output of subtractor 146A (or 146B) for the example being considered. This spectrum contains only the signal component, since the spurious component has been subtractively eliminated.

In the embodiment of FIG. 6, the frequency FLO of the LO in the IQ_Demodulator 116 is set to be equal to the carrier frequency Fcarrier of the input signal. The spectra of the signals I and Q at the IQ_Demodulator outputs (and applied to inputs PreI and PreQ of spurious components suppression unit 140) occupy the frequency band from f=0 to f=BW/2.

The main difference between the block diagram of FIG. 6 and the block diagram of FIG. 3 is the structure of the mismatch equalizers (II, IQ, QI, QQ) 144i and the averaged responses equalizers (II, IQ, QI, QQ) 152i of output forming unit 150. Since the direct transfer to the frequency band f=0 to f=BW/2 is carried out with a folding of the signal spectrum, the mismatch equalizer 150 and the averaged responses equalizers of output forming unit 150 have cross-coupling branches IQ and QI along with direct branches II and QQ. Further, the direct frequency transfer makes the second stage of down conversion in the output forming unit 150 unnecessary, so it is omitted.

Figure 7:
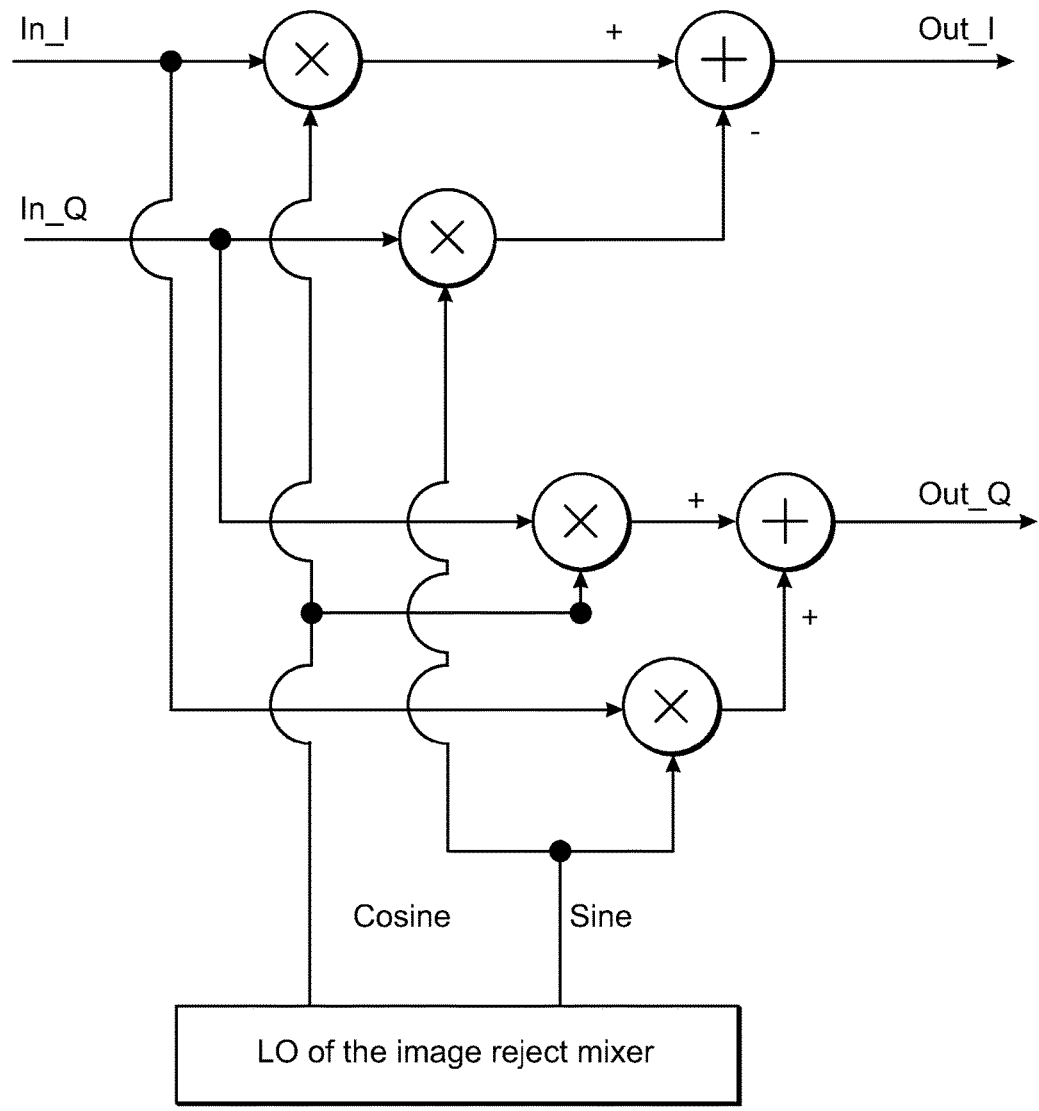
FIG. 7 shows block diagram of the image reject mixer.

Due to decimation, the spectra of the signals at inputs PreI and PreQ produced by IQ_Demodulator 116, are limited by a frequency that is close to the Nyquist frequency. For this reason, it is difficult to build a low pass filter that suppress the image band that appears during the frequency transformation in the spectrum rotator 142 and in the second stage of down conversion corresponding to the structure of FIG. 3. To overcome that difficulty filter-less image reject mixers are used, a technique well known to those experienced in the art. FIG. 7 shows block diagrams of such a mixer, where output signals Out I and Out Q are linked to the input signals In_I and In_Q by corresponding equations:

$$\text{Out\_}I(t)=\text{In\_}I(t)\cos 2\pi Fct - \text{In\_}Q(t)\sin 2\pi Fct \qquad a.$$

$$\text{Out\_}Q(t)=\text{In\_}I(t)\sin 2\pi Fct + \text{In\_}Q(t)\cos 2\pi Fct, \qquad b.$$

where Fc is a carrier frequency of the corresponding frequency transformation.

Figure 8:
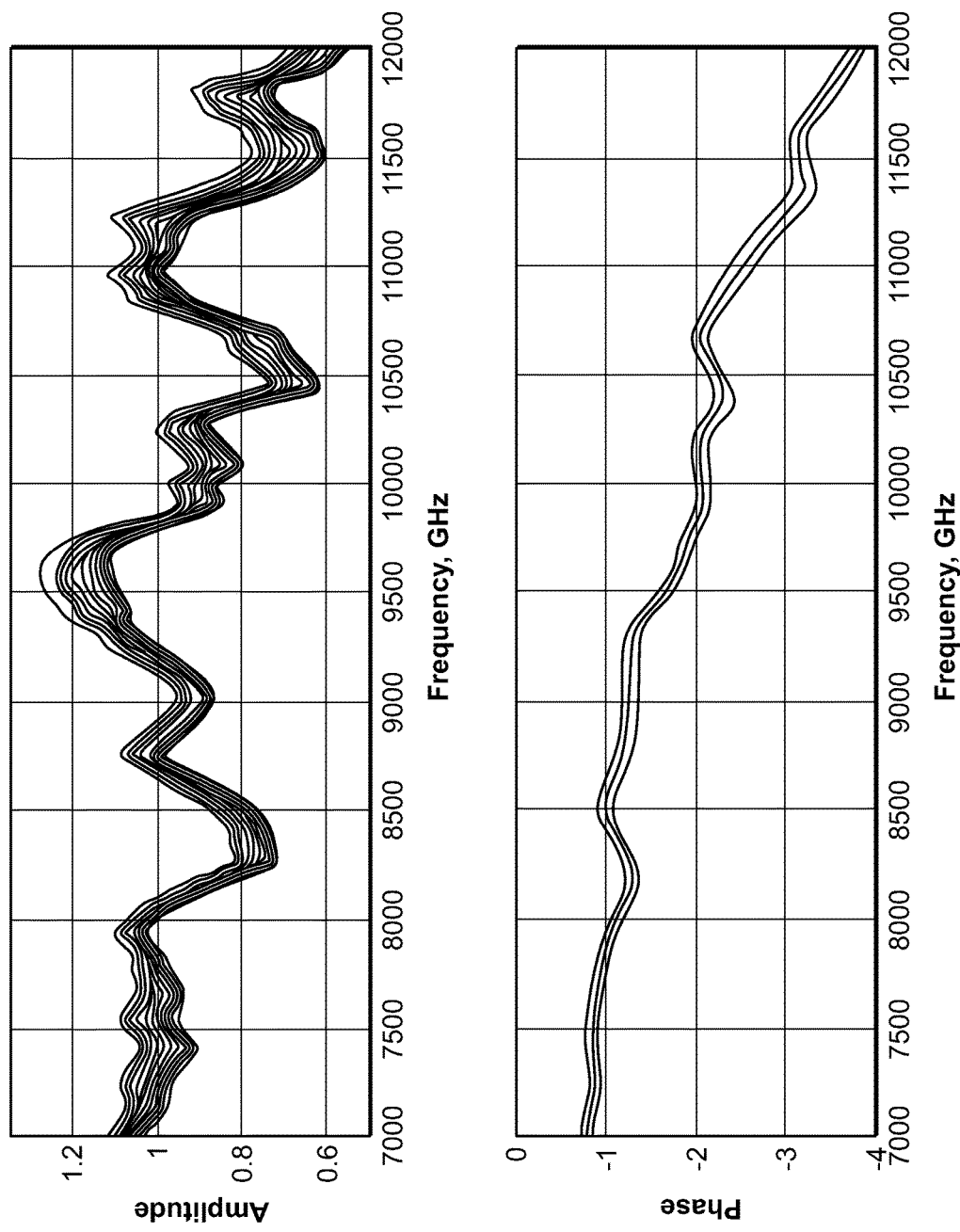
FIG. 8 shows measured frequency responses of 40 sub ADCs of 40 GHz interleaved ADC.

The down converter 108 with equalization in the form of FIG. 3 was verified using a 40 Gs/s composite ADC comprising 40 sub-ADCs. FIG. 8 illustrates a superposition of measured individual sub-ADCs amplitude and phase responses in the range 7-12 GHz. As it may be seen, the amplitude and phase responses of the individual sub-ADCs exhibit significant variation.

Figure 9A:
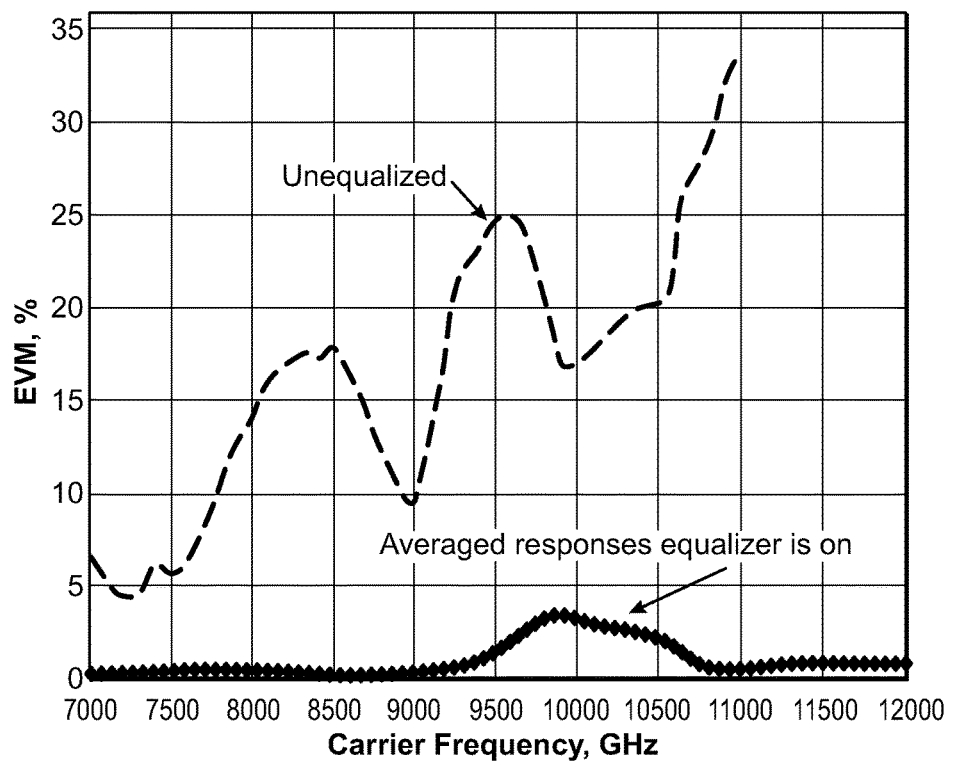
FIGS. 9A-9B show error vector magnitudes as a function of the frequency for a 16 level QAM signal.
Figure 10A:
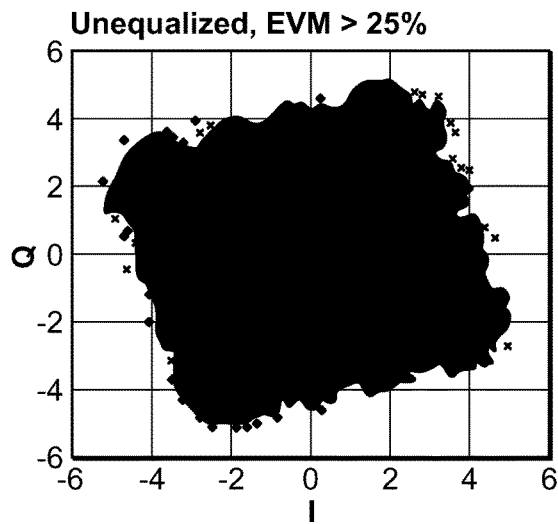
FIGS. 10A-10C show constellation diagrams of quadrature amplitude modulated signal (16 levels QAM) at the output of the down converter with and without equalization.

A 16-level QAM modulated signal with bandwidth 1 GHz was applied to the input of the digital down converter. The carrier frequency of the signal was varied in the range 7-12 GHz. When both the mismatch and averaged responses equalizers in the digital down converter were switched off, the error vector magnitude (EVM) in the demodulated signal amounted up to 20-30% (see FIG. 9A). The signal areas in a corresponding constellation diagram (see FIG. 10A) overlap completely.

Figure 9B:
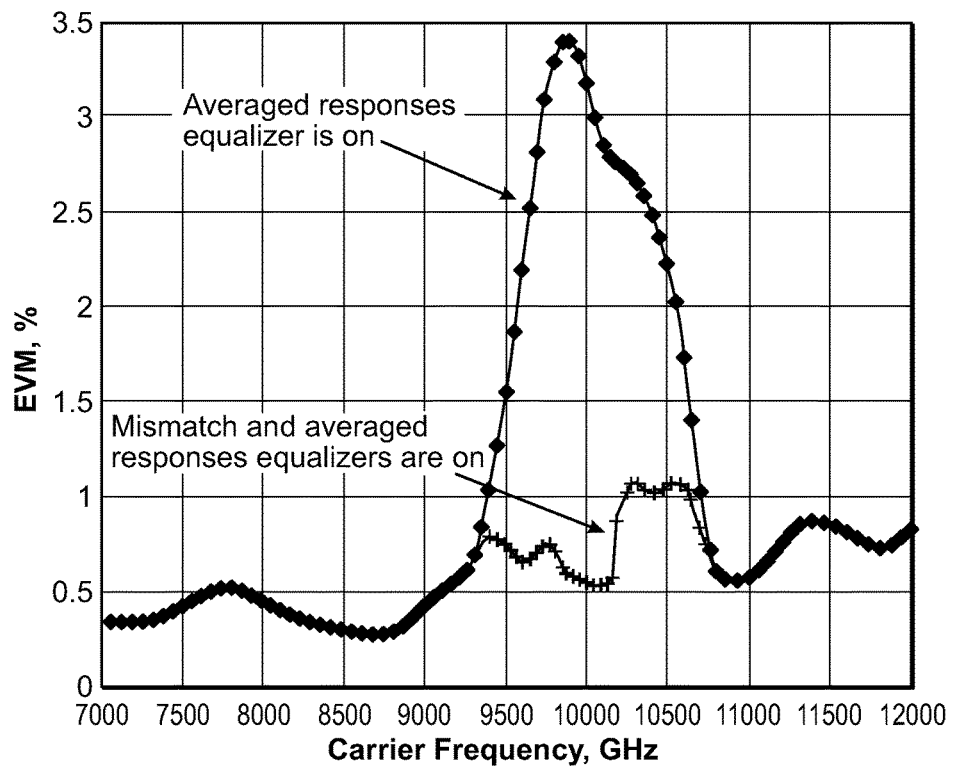
Figure 10B:
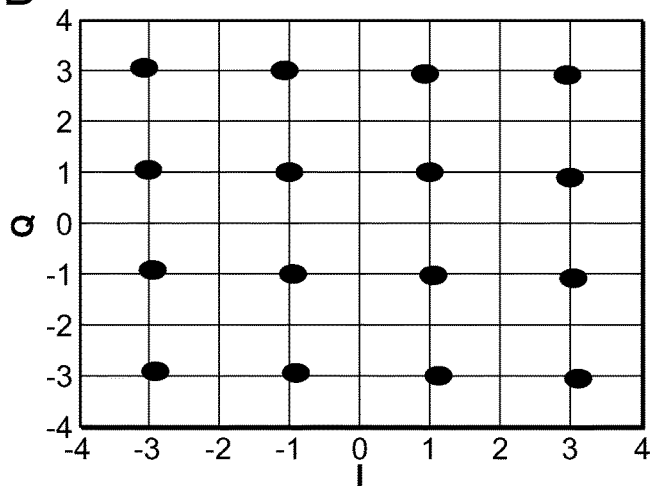

When the averaged responses equalizer was switched on, the EVM decreased below 3-3.5% (see FIGS. 9B and 10B). A distinct peak of EVM is seen in the region 9.5-10.5 GHz. This peak is caused by the spurious component occurring in the signal passband, reflected from 40/2=20 GHz.

Figure 10C:
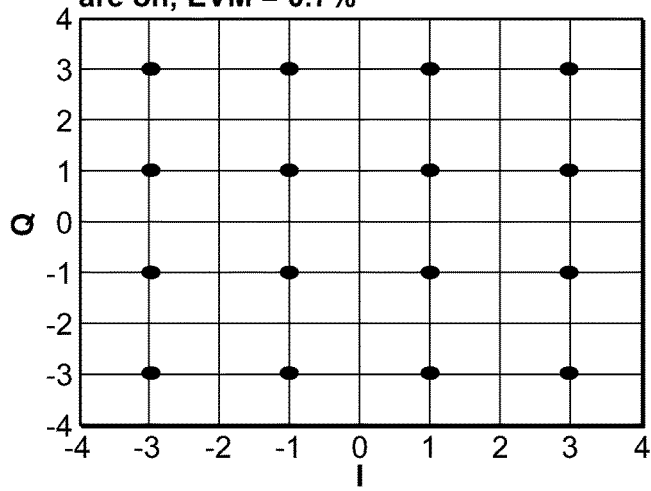

When a mismatch equalizer was switched on, in addition to the averaged responses equalizer, the EVM in the demodulated signal dropped down below 1% (see FIGS. 9B and 10C).

It is difficult to determine for all possible cases, which of the exemplary embodiments requires less computing recourses. When designing a specific digital down converter with equalization, it is necessary to evaluate computing recourses required by each of the embodiments, and choose the more economical one.

Although this technology has been described in terms of certain embodiments, other embodiments that are apparent to those skilled in the art, including embodiments which do not provide all the benefits and features are also within the scope of this technology.

The invention claimed is:

1. A digital down converter characterized by a bandwidth BW extending about a relatively high carrier frequency F, comprising:
   A) a composite ADC including a set of interleaved sub-ADCs with a sampling rate SR, and having a signal input for receiving an analog signal characterized by a bandwidth less than or equal to BW centered about carrier having frequency F, and an output for providing a digital ADC output signal representative of the received analog signal;
   B) IQ_Demodulator having a signal input, connected to the output of the ADC, an InPhase output and a Quadrature output, said IQ_Demodulator being configured to perform a down conversion frequency shift of the ADC output signal to a relatively low frequency band whereby an in-phase down converted signal is provided at the InPhase output, and a quadtature down converted signal is provided at the Quadrature output;
   C) a spurious component suppression unit having an I input connected to the InPhase output and a Q input connected to the Quadrature output of the IQ_Demodulator, wherein said spurious component suppression unit includes a mismatch amplitude and phase equalizer operative over the low frequency band to provide an in-phase output signal and a quadrature output signal characterized by a bandwidth in the low frequency band with reduced spurious components, and
   D) an output forming unit having an in-phase input and a quadrature input coupled to a respective one of the in-phase output signal and the quadrature output signal of the spurious component suppression unit, and operative to transform the signals received from the spurious component suppression unit into output signals of the digital down converter.

2. A digital down converter according to claim 1, wherein the spurious component suppression unit comprises:
   a) a spectrum rotator having in-phase and quadrature inputs, connected to the corresponding inputs of the spurious component suppression unit, and in-phase and quadrature outputs, said spectrum rotator being configured to perform a frequency transformation that rotates the signal spectrum of the in-phase down converted signal received from the InPhase output, and the quadrature down converted signal received from the Quadrature output, about a pivot frequency, to generate in-phase and quadrature spectral rotated signals at in-phase and quadrature spectrum rotator outputs; and
   b) a mismatch equalizer.

3. A digital down converter according to claim 2, wherein the mismatch equalizer comprises:
   i) in-phase and quadrature mismatch equalizer inputs connected to the respective in-phase and quadrature spectrum rotator outputs, said mismatch equalizer being configured to change the amplitude and phase of each frequency component of the input signal making them equal to the amplitude and phase of the corresponding spurious component; and
   ii) an in-phase subtractor and a quadrature subtractor, wherein the subtractors each have a first input connected to the corresponding input of the spurious component suppression unit, and a second input connected to the corresponding output of the mismatch equalizer, and an output of the spurious component suppression unit, and producing at its output a difference between the signal at its first input and the signal at its second output.

4. A digital down converter according to claim 2, wherein the IQ_Demodulator includes an in-phase multiplier, a quadrature multiplier, and a local oscillator (LO) having a first LO output providing a sinusoidal in-phase multiplier signal at a local oscillator frequency LOF and a second LO output providing a sinusoidal quadrature multiplier signal at the local oscillator frequency LOF, wherein the in-phase multiplier signal and the quadrature multiplier signal are offset in phase by 90 degrees, and, wherein each of the multipliers has a signal input coupled to the ADC output and a multiplier input coupled to one of the first LO output and the second LO output, and has a multiplier output providing a product of the signals at its signal input and its multiplier input, wherein each of the multiplier outputs is coupled by way of a low pass filter and decimator to an associated one of the in-phase and quadrature inputs of the spectrum rotator, and wherein the frequency of the sinusoidal in-phase multiplier signal and the sinusoidal quadrature multiplier signal local oscillator is equal to F−BW/2.

5. A digital down converter according to claim 2, wherein the mismatch equalizer includes an in-phase mismatch equalizer I and a quadrature mismatch equalizer Q, and wherein the in-phase mismatch equalizer has an in-phase equalizer input connected to an in-phase output of the spectrum rotator, and an in-phase equalizer output, and wherein the quadrature mismatch equalizer has an quadrature equalizer input connected to an quadrature output of the spectrum rotator, and an quadrature equalizer output, and wherein the output forming unit comprises:
   i) an in-phase averaged responses equalizer and a second stage in-phase down converter, said second stage din-phase own converter being configured to carry out a frequency transformation with a carrier frequency equal to BW/2, and
   ii) a quadrature averaged responses equalizer and a second stage quadrature down converter, said second stage quadrature down converter being configured to carry out a frequency transformation with a carrier frequency equal to BW/2.

6. A digital down converter according to claim 2,
A) wherein the frequency of the sinusoidal in-phase multiplier signal and the sinusoidal quadrature multiplier signal local oscillator is equal to F;
B) wherein the mismatch equalizer includes:
   i) in-phase and quadrature mismatch equalizer inputs connected to the respective in-phase and quadrature spectrum rotator outputs,
   ii) an in-phase subtractor, wherein the in-phase subtractor has a first I subtractor input connected to the in-phase mismatch equalizer input, and a second I subtractor input, and an I subtractor output, wherein the in-phase subtractor is operative to provide at the I subtractor output, a signal representative of the difference of the signals at the first I subtractor input and the second I subtractor input,
   iii) a quadrature subtractor, wherein the quadrature subtractor has a first Q subtractor input connected to the quadrature mismatch equalizer input, a second Q subtractor input, and a Q subtractor output, wherein the quadrature subtractor is operative to provide at the Q subtractor output, a signal representative of the difference of the signals at the first Q subtractor input and the second Q subtractor input,
   iv) an in-phase adder, wherein the in-phase adder has a first I adder input connected to the quadrature mismatch equalizer input, and a second I adder input, and an I adder output, wherein the in-phase adder is operative to provide at the I adder output, a signal representative of the sum of the signals at the first I adder input and the second I adder input,
   v) a quadrature adder, wherein the quadrature adder has a first Q adder input connected to the quadrature mismatch equalizer input, and a second Q adder input, and an Q adder output, wherein the quadrature adder is operative to provide at the Q adder output, a signal representative of the sum of the signals at the first Q adder input and the second Q adder input,
   vi) an I-I mismatch equalizer having an I-I input connected to the in-phase mismatch equalizer input, and an I-I output connected to first I adder input,
   vii) an I-Q mismatch equalizer having an I-Q input connected to the in-phase mismatch equalizer input, and an I-Q output connected to the second Q adder input,
   viii) a Q-Q mismatch equalizer having an Q-Q input connected to the quadrature mismatch equalizer input, and a Q-Q output, connected to the first Q adder input, and
   ix) a Q-I mismatch equalizer having an Q-I input connected to the quadrature mismatch equalizer input, and a Q-I output connected to the second I adder input,
   wherein said mismatch equalizers are configured to change the amplitude and phase of each frequency component their respective input signals and making the amplitude and phase of each frequency component equal to the amplitude and phase of the corresponding spurious component.

7. A digital down converter according to claim 6, wherein the output forming unit comprises:
   i) an I-I averaged responses equalizer having an I-I averaged responses input connected to the I subtractor output of the in-phase subtractor of the mismatch equalizer, and an I-I averaged responses output,
   ii) an I-Q averaged responses equalizer having an I-Q averaged responses input connected to the I subtractor output of the in-phase subtractor of the mismatch equalizer, and an I-Q averaged responses output,
   iii) a Q-Q averaged responses equalizer having an Q-Q averaged responses input connected to the Q subtractor output of the quadrature subtractor of the mismatch equalizer, and an a Q-Q averaged responses output,
   iv) a Q-I averaged responses equalizer having a Q-I averaged responses input connected to the Q subtractor output of the in-phase subtractor of the mismatch equalizer, and an I-Q averaged responses output,
   v) an in-phase output adder, wherein the in-phase output adder has a first I O/P adder input connected to the I-I averaged responses output of the I-I averaged responses equalizer, and has second I O/P adder input connected to the I-Q averaged responses output of the I-Q averaged responses equalizer, and an I O/P adder output, and
   vi) a quadrature output adder, wherein the quadrature output adder has a first Q O/P adder input connected to the Q-Q averaged responses output of the Q-Q averaged responses equalizer, and has second Q O/P adder input connected to the Q-I averaged responses output of the Q-I averaged responses equalizer, and a Q O/P adder output,
   wherein the I O/P adder output and the Q O/P adder output provide signals representative of the input analog signal at baseband centered at zero frequency.

8. A digital down converter with equalization with a conversion frequency F and bandwidth BW, comprising:
A) a high speed composite ADC consisting of a set of sub ADCs with a total sampling rate SR, having a signal input, used as an analog signal input of the down converter, and an output;

B) IQ_Demodulator having a signal input, connected to the output of the ADC, an InPhase output and Quadratur output, said IQ_Demodulator being configured to perform frequency transfer of the ADC output signal to the low frequencies region;

C) a spurious component suppression unit having two inputs connected to correspondent outputs of the IQ_Demodulator and two outputs, said spurious component configured to eliminate spurious component in the processed signal;

D) an output forming unit having two inputs connected to correspondent outputs of the spurious component suppression unit and two outputs, said output forming unit being configured to transform the signals received from the spurious component suppression unit into output signals of the digital down converter with equalization.

9. A digital down converter with equalization as in the claim 8, wherein the spurious component suppression unit comprises:

a) a spectrum rotator having two inputs, connected to the correspondent inputs of the spurious component suppression unit, and two outputs, said spectrum rotator being configured to perform a frequency transformation that turns over the signal spectrum around a chosen pivot frequency;

b) a mismatch equalizer with two inputs connected to the outputs of the spectrum rotator and two outputs, said mismatch equalizer being configured to change the amplitude and phase of each frequency component of the input signal making them equal to the amplitude and phase of the correspondent spurious component;

c) subtractor I and subtractor Q, each of subtractors having the first input, connected to the correspondent input of the spurious component suppression unit, the second input, connected to the output of mismatch equalizer, and an output that is used as one of outputs of the spurious component suppression unit, and producing at its output a difference between the signal at its first input and the signal at its second output.

10. A digital down converter with equalization as in the claim 9, wherein

A) the frequency of the local oscillator incorporated in the IQ_Demodulator is set to be equal to F−BW/2;

B) the mismatch equalizer consists of a mismatch equalizer I and a mismatch equalizer Q, either of them having an input, connected to the correspondent output of the spectrum rotator, and an output, being used as the correspondent mismatch equalizer output; and C) the output forming unit comprises averaged responses equalizer I and averaged responses equalizer Q, as well as a second stage of down conversion, said second stage of down conversion being configured to carry out a frequency transformation with a carrier frequency equal BW/2.

11. A digital down converter with equalization as in the claim 9, wherein

A) the frequency of the local oscillator, incorporated in the IQ_Demodulator, is set to be equal to F;

B) the mismatch equalizer consists of:
a) adder I and adder Q, either of them having two inputs and an output, wherein the output of adder I is connected to the second input of the subtractor I and the output of adder Q is connected to the second input of the subtractor Q;
b) a mismatch equalizer II, having an input, connected to the I output of the spectrum rotator, and an output, connected to an input of adder I;
c) a mismatch equalizer IQ, having an input, connected to the I output of the spectrum rotator, and an output, connected to an input of adder Q;
d) a mismatch equalizer QQ, having an input, connected to the Q output of the spectrum rotator, and an output, connected to an input of adder Q;
e) a mismatch equalizer QI, having an input, connected to the Q output of the spectrum rotator, and an output, connected to an input of adder I; and C. The output forming unit consists of:
a) adder I and adder Q, each adder having two inputs and an output, whereas the output of adder I is used as I output of the output forming unit, and the output of adder Q is used as Q output of the forming unit;
b) an averaged responses equalizer II, having an input, connected to the I input of the output forming unit, and an output, connected to an input of adder I;
c) an averaged responses equalizer IQ, having an input, connected to the I input of the output forming unit, and an output, connected to an input of adder Q;
d) an averaged responses equalizer QQ, having an input, connected to the Q input of the output forming unit, and an output, connected to an input of adder Q;
e) an averaged responses equalizer QI, having an input, connected to the Q input of the output forming unit, and an output, connected to an input of adder I.

12. A digital down converter with equalization of claim 9, comprising also a memory for keeping the results of measurement of composite ADC responses, these results being used for rapid calculation of mismatch equalizers and response equalizers coefficients, when a change of down converter parameters is required.

* * * * *